(12) United States Patent
Mazara Diaz et al.

(10) Patent No.: US 9,625,499 B2
(45) Date of Patent: Apr. 18, 2017

(54) RECEPTACLE INDICATING RELATIVE LEVEL OF CURRENT OR ENERGY

(71) Applicant: EATON CORPORATION, Cleveland, OH (US)

(72) Inventors: Hoyma Joel Mazara Diaz, Distrito Nacional (DO); Sandy Omar Jimenez Gonzalez, Monaca, PA (US); Glennys Johanny De Jesus Reyes, San Cristobal (DO); Mario Nunez Hernandez, Santo Domingo Oeste (DO)

(73) Assignee: EATON CORPORATION, Cleveland, OH (US)

( * ) Notice: Subject to any disclaimer, the term of this patent is extended or adjusted under 35 U.S.C. 154(b) by 244 days.

(21) Appl. No.: 14/267,053

(22) Filed: May 1, 2014

(65) Prior Publication Data

US 2015/0316589 A1 Nov. 5, 2015

(51) Int. Cl.

| G01R 1/00 | (2006.01) |
|---|---|
| G01R 19/165 | (2006.01) |
| G01R 21/133 | (2006.01) |
| G01R 21/00 | (2006.01) |
| H02H 3/04 | (2006.01) |

(Continued)

(52) U.S. Cl.
CPC ........... *G01R 19/165* (2013.01); *G01R 21/00* (2013.01); *G01R 21/133* (2013.01); *H02H 3/04* (2013.01); *H02H 3/08* (2013.01); *H02H 3/0935* (2013.01); *B60L 1/00* (2013.01); *G01R 1/00* (2013.01);

(Continued)

(58) Field of Classification Search
CPC ..... G01R 1/00; H02H 1/00; H02J 1/00; B60L 11/00; B60L 2200/00
See application file for complete search history.

(56) References Cited

U.S. PATENT DOCUMENTS

| 5,644,238 A * | 7/1997 | Seifert .................. G01R 19/30 |
| | | 324/132 |
| 6,850,073 B2 * | 2/2005 | Elms .................... G01R 31/041 |
| | | 324/424 |

(Continued)

FOREIGN PATENT DOCUMENTS

| EP | 2 387 120 A2 | 11/2011 |
| WO | 2010/026481 A1 | 3/2010 |

OTHER PUBLICATIONS

European Patent Office, "Partial International Search Report (Invitation to Pay Additional Fee . . . ) for corresponding PCT Application No. PCT/US2015/022876", Sep. 1, 2015, 5 pp.

*Primary Examiner* — Jermele M Hollington
*Assistant Examiner* — Temilade Rhodes-Vivour
(74) *Attorney, Agent, or Firm* — Eckert Seamans; Nathaniel Wilks; Grant Coffield (57) ABSTRACT

A smart receptacle is for a number of loads. The smart receptacle includes separable contacts; an operating mechanism structured to open and close the separable contacts; and a number of current sensors structured to sense current flowing through the separable contacts to one of the number of loads. A number of indicators indicate a relative level of the sensed current or corresponding energy. A processor inputs the sensed current, determines the relative level of the sensed current or the corresponding energy, and controls the number of indicators to indicate the relative level of the sensed current or the corresponding energy.

22 Claims, 5 Drawing Sheets

(51) Int. Cl.
 *H02H 3/08* (2006.01)
 *H02H 3/093* (2006.01)
 *H02J 1/00* (2006.01)
 *B60L 1/00* (2006.01)
 *H01R 103/00* (2006.01)
 *H01R 13/66* (2006.01)
 *H01R 24/78* (2011.01)

(52) U.S. Cl.
 CPC ............ *H01R 13/665* (2013.01); *H01R 24/78* (2013.01); *H01R 2103/00* (2013.01); *H02J 1/00* (2013.01)

(56) References Cited

U.S. PATENT DOCUMENTS

| | | | |
|---|---|---|---|
| 7,751,160 B1* | 7/2010 | Radosavljevic | H01H 83/04 |
| | | | 324/424 |
| 2005/0102043 A1* | 5/2005 | Menas | G06F 1/26 |
| | | | 700/22 |
| 2006/0170410 A1* | 8/2006 | Bjorn | G01R 15/246 |
| | | | 324/96 |
| 2007/0013361 A1* | 1/2007 | Burlak | H02M 1/32 |
| | | | 324/142 |
| 2010/0157486 A1 | 6/2010 | Parker et al. | |
| 2011/0216453 A1* | 9/2011 | Haines | H02H 9/00 |
| | | | 361/49 |
| 2014/0015482 A1 | 1/2014 | Nitzberg et al. | |

\* cited by examiner

RECEPTACLE INDICATING RELATIVE LEVEL OF CURRENT OR ENERGY

BACKGROUND

Field

The disclosed concept pertains generally to electrical switching apparatus and, more particularly, to smart receptacles. The disclosed concept further pertains to receptacles, electrical cord sets, electric cords and electric outlets for a number of loads.

Background Information

Homeowners, apartment dwellers, small business owners and the like constantly want to save energy. However, known power systems are complex and are not understandable by most people. Such consumers of energy need a simple way to know if a power circuit is drawing too much current and if it has been doing so for a relatively long period of time.

Some circuit breakers have a "thermal memory" (which may be ambient temperature compensated) and estimate how long a power circuit can handle an overload. This time is based on the current level. For example, miniature circuit breakers open a power circuit in less than one or two hours (based on the amperage rating) when loaded an additional 35% above its rating, open the power circuit in less than two or four minutes (based on the amperage rating) when loaded an additional 100% above its rating, and remain closed when loaded at 100% or less of its amperage rating.

There is room for improvement in receptacles.

SUMMARY

These needs and others are met by embodiments of the disclosed concept in which a receptacle includes a plurality of indicators having different possible intensities and/or colors in order to indicate one or both of: (1) relative level of power or current or energy consumption, and (2) length of time a number of loads have been consuming such power or current or energy.

In accordance with one aspect of the disclosed concept, a smart receptacle for a number of loads comprises: separable contacts; an operating mechanism structured to open and close the separable contacts; a number of current sensors structured to sense current flowing through the separable contacts to one of the number of loads; a number of indicators structured to indicate a relative level of the sensed current or corresponding energy; and a processor structured to input the sensed current, determine the relative level of the sensed current or the corresponding energy, and control the number of indicators to indicate the relative level of the sensed current or the corresponding energy.

As another aspect of the disclosed concept, a receptacle plate or cover for a receptacle comprises: a plate or cover member; a number of current sensors disposed on or about the plate or cover member and structured to sense current flowing through separable contacts to a load; a number of indicators disposed on or about the plate or cover member and structured to indicate a relative level of the sensed current or corresponding energy; and a processor disposed on or about the plate or cover member and structured to input the sensed current, determine the relative level of the sensed current or the corresponding energy, and control the number of indicators to indicate the relative level of the sensed current or the corresponding energy.

As another aspect of the disclosed concept, a receptacle, an electrical cord set, an electric cord or an electric outlet comprises: separable contacts; an operating mechanism structured to open and close the separable contacts; a current sensor structured to sense current flowing through the separable contacts to a load; a number of indicators structured to indicate a relative level of the sensed current or corresponding energy; and a processor structured to input the sensed current, determine the relative level of the sensed current or the corresponding energy, and control the number of indicators to indicate the relative level of the sensed current or the corresponding energy.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the term "processor" shall mean a programmable analog and/or digital device that can store, retrieve, and process data; a computer; a workstation; a personal computer; a controller; a digital signal processor; a microprocessor; a microcontroller; a microcomputer; a central processing unit; a mainframe computer; a mini-computer; a server; a networked processor; or any suitable processing device or apparatus.

As employed herein, the statement that two or more parts are "connected" or "coupled" together shall mean that the parts are joined together either directly or joined through one or more intermediate parts. Further, as employed herein, the statement that two or more parts are "attached" shall mean that the parts are joined together directly.

The disclosed concept is described in association with receptacles, although the disclosed concept is applicable to a wide range of electrical switching apparatus including, for example and without limitation, smart receptacles, ground fault receptacles, arc fault receptacles, arc fault/ground fault receptacles, smart ground fault receptacles, remote operated receptacles, electrical cord sets, electric cords and electric outlets.

Figure 1:
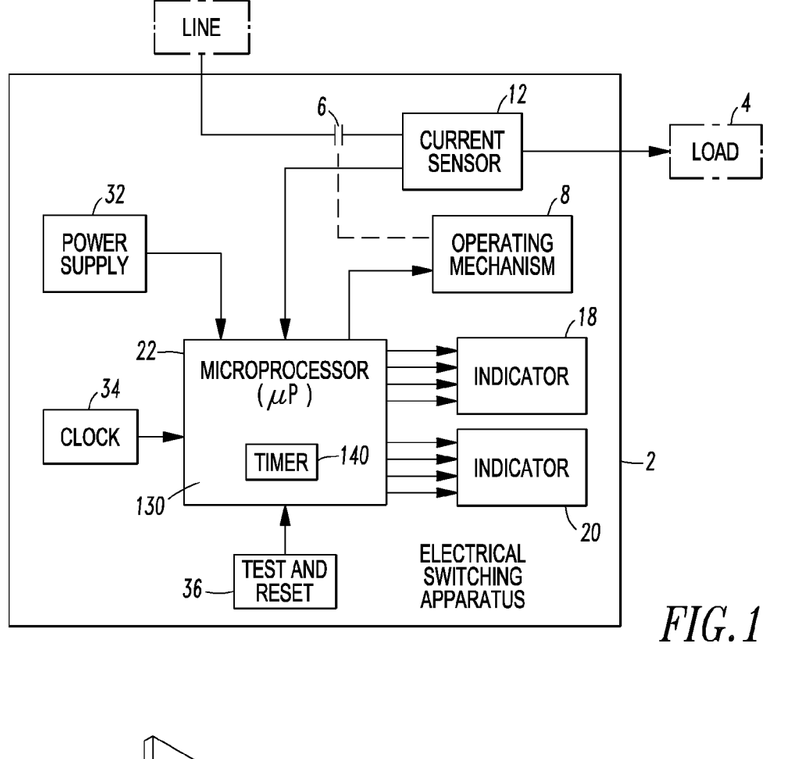
FIG. 1 is a block diagram of an electrical switching apparatus in accordance with embodiments of the disclosed concept.

Referring to FIG. 1, an electrical switching apparatus 2, such as a smart receptacle for a number of loads 4 (only one example load 4 is shown in phantom line drawing), is shown. It will be appreciated that the electrical switching apparatus 2 can also be a receptacle, a ground fault receptacle, an arc fault receptacle, an arc fault/ground fault receptacle, an electrical cord set, an electric cord or an electric outlet. The electrical switching apparatus 2 includes separable contacts 6, an operating mechanism 8 structured to open and close the separable contacts 6, and a current sensor 12 (or a number of current sensors 14 or 16 as shown, respectively, in FIGS. 2 and 4) structured to sense current flowing through the separable contacts 6 to a load, such as one of the number of loads 4. The electrical switching apparatus 2 further includes a number of indicators (two example indicators 18,20 are shown in FIG. 1) structured to indicate a relative level of the sensed current or corresponding energy from the current sensor 12, and a processor, such as the example microprocessor (μP) 22, structured to input the sensed current from the current sensor 12, determine the relative level of the sensed current or the corresponding energy, and control the number of indicators 18,20 to indicate the relative level of the sensed current or the corresponding energy. This input, determination and indication will be discussed, below, in greater detail in connection with FIGS. 2-7.

The number of current sensors 12 may include a current sensor selected from the group consisting of a current transformer (CT) (see, for example, the CTs 24,26 of FIGS. 2 and 3, and the CTs 28,30 of FIGS. 4 and 5), a resistive shunt and another suitable current sensing device (e.g., without limitation, a Hall effect sensor; a Rogowski coil). Although the example CTs 24,26 and 28,30 are shown behind the receptacle plates or covers 42 and 82, the disclosed concept is also applicable to embodiments in which the CT(s) are part of or mounted on or about the cover members 58 and 96, respectively, such that the hot prong or bus bar of the electrical load, appliance or electrical device (not shown) passes through the corresponding CT. This simplifies the wiring process for the electrician and also saves space inside the electrical box 54 or 122 where the receptacle 56 or 84, respectively, is normally installed.

The electrical switching apparatus 2 and/or the microprocessor 22 may be further structured to provide ground fault and/or arc fault and/or surge protection. As is conventional, the microprocessor 22 is powered by a power supply 32, receives or includes a suitable clock 34, and can include an optional test and reset circuit 36.

Figure 2:
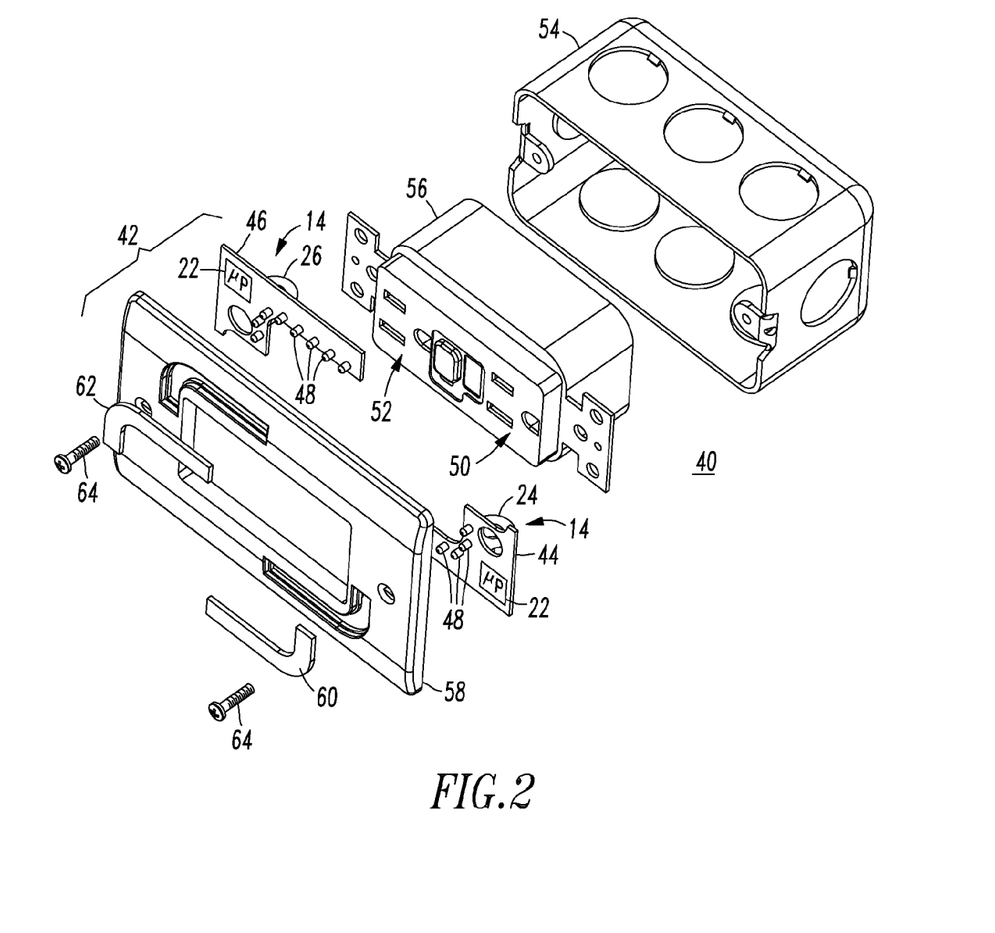
FIG. 2 is an exploded isometric view of a receptacle in accordance with another embodiment of the disclosed concept.
Figure 3:
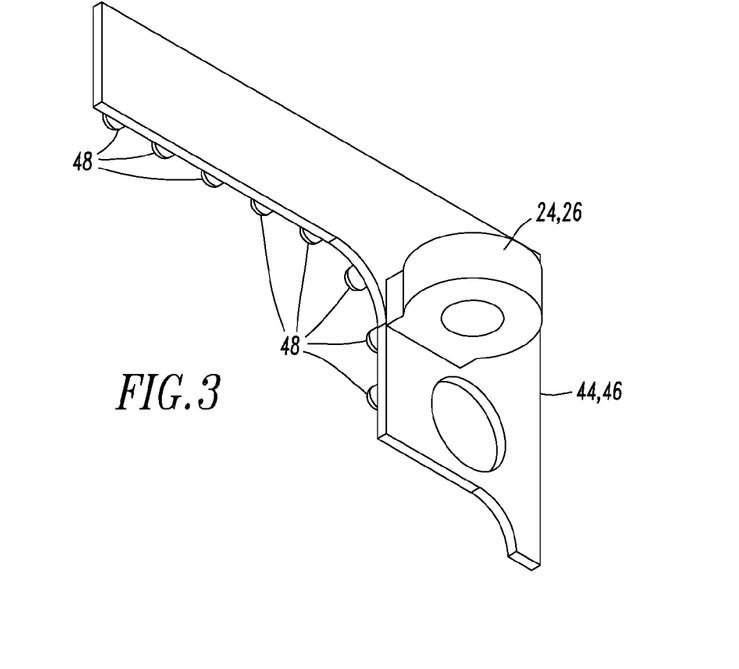
FIG. 3 is a rear isometric view of one of the printed circuit boards of FIG. 2.

Referring to FIGS. 2 and 3, a receptacle 40 or a receptacle plate or cover 42 includes a number of integrated printed circuit boards (PCBs) (e.g., without limitation, two example PCBs 44,46 are shown) having a plurality of indicators (e.g., without limitation, lights, such as example LED lights 48) that can produce a plurality of different colors (e.g., without limitation, green for OK; yellow or orange for caution; red for a problem), and that can, for example and without limitation, stay on, turn off, blink or dim to indicate if the corresponding power circuit (e.g., for a load (not shown, but see the load 4 of FIG. 1)) has been drawing too much current or power (e.g., based upon a suitable color spectrum or color code) and/or if such power circuit has been doing so for a relatively long period of time (e.g., without limitation, a suitable combination of a color change, an intensity change and/or a blink frequency change). The example receptacle 40 includes two outlets 50,52. Here, the number of current sensors include the two example CTs 24,26, one for each of the two respective outlets 50,52.

In the event of an overload or a short circuit, circuit breakers (not shown) are responsible to protect power circuit conductors. A receptacle, such as 40, can be calibrated to open the power circuit (e.g., for the load 4 of FIG. 1; for one or both of the outlets 50,52) after a predetermined time under certain current conditions. For example, a suitable color code of the example LED lights 48 can indicate to a user how close the receptacle 40 is to disconnection of the corresponding power circuit for one of the outlets 50,52. The color code indicates the overall status for the corresponding branch power circuit. The color code considers the total amount of power or current or energy that the receptacle outlet 50 or 52 is handling and the amount of power or current or energy handled by other receptacle outlets within the same branch circuit (e.g., without limitation, obtained by power line carrier communication; and/or wireless communication).

For example, the PCB 44 or 46 senses power circuit current flow through a corresponding power circuit conductor with a suitable current sensor (e.g., without limitation, the CTs 24 and/or 26; a resistive shunt (not shown, but see the current sensor 12 of FIG. 1); a suitable current sensing device (not shown, but see the current sensor 12 of FIG. 1)). The example receptacle 40 includes a conventional electrical box (receptacle box) 54, a conventional ground fault receptacle or other suitable receptacle 56, a receptacle plate or cover member 58 with one or two clear lens 60,62, the color (e.g., without limitation, RGB or red, green and blue) LEDs 48 on the PCBs 44,46 (as best shown in FIG. 3) behind the lens 60,62, the two CTs 24,26 for current, power or energy monitoring, and two fasteners 64. Although two PCBs 44,46 are shown in FIG. 2, there could alternatively be a single PCB (as shown with the PCB 66 in FIG. 4) for the entire receptacle 40 with LEDs 48 at desired locations (e.g., without limitation, one set of LEDs per receptacle; one set of LEDs for each outlet 50,52). The CTs 24,26 are provided for the two respective outlets 50,52.

As shown in FIGS. 2 and 3, the color LEDs 48 on the PCB 44 are for the outlet 50 and the color LEDs 48 on the PCB 46 are for the outlet 52. In this embodiment, each load (not shown, but see the load 4 of FIG. 1) for the corresponding one of the outlets 50,52 is operatively associated with a plurality of the color LEDs 48. While these LEDs 48 can indicate progressively larger values of the sensed current by lighting progressively larger counts of the LEDs 48, the disclosed concept preferably employs the example color LEDs 48 to indicate a plurality of different colors each of which corresponds to a corresponding level of the sensed current in order to indicate the relative level of the sensed current or corresponding energy. For example and without limitation, the plurality of different colors include a first color for an acceptable level of the sensed current, a second different color for a larger cautionary level of the sensed current, and a third different color for a still larger problem level of the sensed current. Furthermore, the μP 22 of the PCBs 44,46 is preferably further structured to change at least one of color, intensity and blink frequency of a number of the plural color LEDs 48 if the corresponding load (not shown, but see the load 4 of FIG. 1) has been drawing too much current or power and/or doing so for greater than a predetermined time period. This will be discussed in greater detail, below, in connection with FIG. 7.

The example receptacle plate or cover 42 includes the receptacle plate or cover member 58, the number of CTs 24,26 disposed on or about the plate or cover member 58 by the PCBs 44,46 and structured to sense current flowing through separable contacts (not shown, but see the separable contacts 6 of FIG. 1) to a load (not shown, but see the load 4 of FIG. 1), the LEDs 48 disposed on or about the plate or cover member 58 by the PCBs 44,46 and structured to indicate a relative level of the sensed current or corresponding energy, and the μP 22 disposed on or about the plate or cover member 58 by the PCBs 44,46 and structured to input the sensed current, determine the relative level of the sensed current or the corresponding energy, and control the LEDs 48 to indicate the relative level of the sensed current or the corresponding energy.

As shown in FIGS. 2 and 3, the example μP 22, the color LEDs 48 and the CTs 24 and 26 are carried by the integrated PCBs 44 and 46, respectively. The CTs 24,26 are structured to sense current in one of a hot conductor, a neutral conductor or a ground conductor for the receptacle 40.

Figure 8:
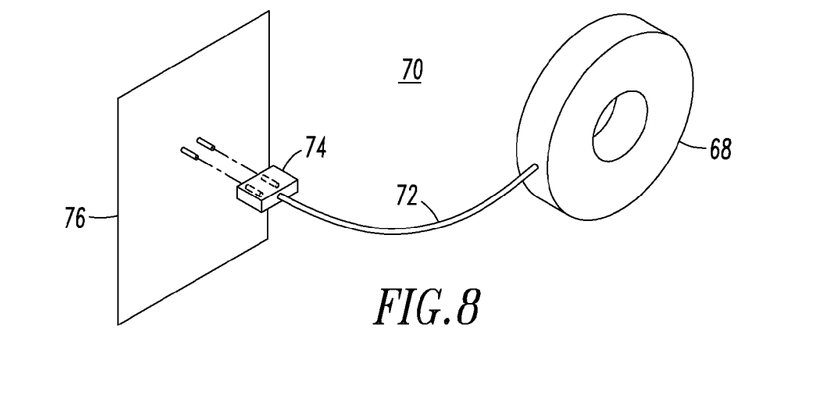
FIG. 8 is an isometric view of a current transformer assembly for a receptacle in accordance with another embodiment of the disclosed concept.

Alternatively, as shown in FIG. 8, a CT 68 is part of a current transformer assembly 70 including a cable harness 72 and PCB connector 74 for field installation to an integrated PCB 76 (e.g., similar to the integrated PCBs 44 and 46 of FIG. 2 but without the CT 24 or 26).

The example color LEDs 48 are preferably structured to indicate the relative level of the sensed current or corresponding energy using a flashing rate and/or color code having a plurality of different colors, one for each of a corresponding range of the sensed current or the corresponding energy. As a non-limiting example, a number of the LEDs 48 have a green/blue color for relatively low loading, a number of LEDs 48 have a yellow/orange color for relatively medium loading, and a number of LEDs 48 have a red color and/or a flashing state in the event of an overload. As another non-limiting example, a number (e.g., one, two or three) of the LEDs 48 are illuminated for relatively low loading, a number (e.g., four, five or six) of the LEDs 48 are illuminated for relatively medium loading, and a number (e.g., seven or eight) of the LEDs 48 are illuminated in the event of an overload. For example, the seventh LED 48 is illuminated for a non-tripped overload condition and the eighth LED 48 is illuminated and flashed for a tripped overload condition. Similarly, the first LED 48 is illuminated for a relatively very low loading, and the second LED 48 is also illuminated for a progressively greater level of low loading. As another example, the first six LEDs would be illuminated for the highest level of medium loading, but less than an overload.

As another non-limiting example of a suitable indicator, a bar (not shown) is made of a series of LEDs (not shown but like the eight LEDs 48) and indicates how much a branch circuit (not shown) is loaded. The bar uses a color code and is aided by a number of LEDs, which increase their indication scale level (increase the number of LEDs that are illuminated) as the power circuit load (e.g., current; power; energy) increases. As a non-limiting example of the color code, a first number of LEDs are a green/blue color for relatively low loading, a second number of LEDS are a yellow/orange color for relatively medium loading, and a third number of LEDS are a red color and/or flashing in the event of an overload.

Figure 4:
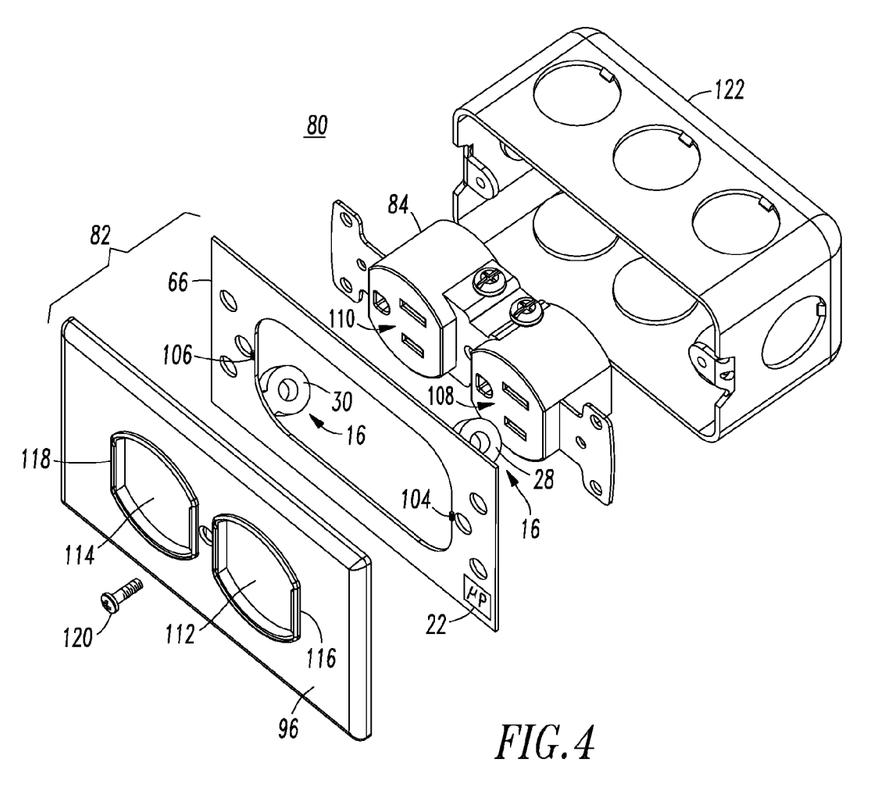
FIG. 4 is an exploded isometric view of a receptacle in accordance with another embodiment of the disclosed concept.
Figure 5:
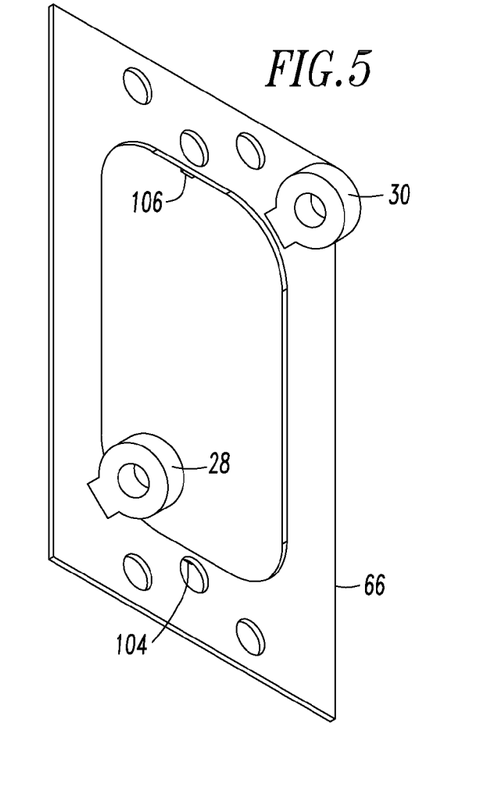
FIG. 5 is a rear isometric view of the printed circuit board of FIG. 4.
Figure 6:
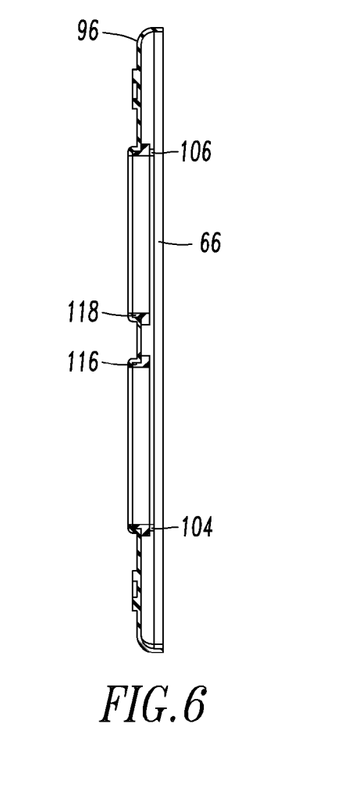
FIG. 6 is a vertical elevation cross-sectional view of the receptacle cover of FIG. 4.

Referring to FIGS. 4-6, another receptacle 80 includes a receptacle plate or cover 82 for a conventional receptacle 84. The receptacle plate or cover 82 includes a plate or cover member 96, a number of current sensors (e.g., without limitation, CTs 28,30) disposed on or about the plate or cover member 96 by a PCB 66 (FIGS. 4 and 5) and structured to sense current flowing through separable contacts (not shown, but see the separable contacts 6 of FIG. 1) to a load (not shown, but see the load 4 of FIG. 1), and a number of indicators (e.g., two color indicators 104,106 are shown in FIGS. 5 and 6) disposed on or about the plate or cover member 96 by the PCB 66 and structured to indicate a relative level of the sensed current or corresponding energy. For example and without limitation, the color indicators 104,106 are surface mount color LEDs on the PCB 66 as shown in FIG. 5. A processor (not shown, but see the microprocessor 22 of FIG. 1) is disposed on or about the plate or cover member 96 by the PCB 66 and is structured to input the sensed current, determine the relative level of the sensed current or the corresponding energy, and control the indicators 104,106 to indicate the relative level of the sensed current or the corresponding energy as will be discussed, below, in connection with FIG. 7.

The conventional receptacle 84 includes two outlets 108, 110. The plate or cover member 96 includes two openings 112,114 each of which is structured to accept a corresponding one of the respective outlets 108,110. The plate or cover member 96 further includes two halo lens 116,118 each of which is disposed around a corresponding one of the two respective openings 112,114. Each of the color indicators 104,106 (FIGS. 4 and 6) is for a corresponding one of the two respective halo lens 116,118 (FIGS. 4 and 6) and can provide current, power or energy monitoring based upon the determined color code for each of the outlets 108,110. Each of the indicators 104,106 is disposed under a corresponding one of the two respective halo lens 116,118 on or about the plate or cover member 96 by the PCB 66. A single fastener 120 fastens the plate or cover member 96 and the PCB 66 therein (as shown in FIG. 6) to the receptacle 84 within a conventional electrical box (or receptacle box) 122. The CT current sensors 28,30 are provided for the two respective outlets 108,110. Here, the example disclosed color code can be employed for each of the two outlets 108,110.

Alternatively, as shown in FIG. 8, each of the CT current sensors 28,30 can be part of the example current transformer assembly 70. The CT current sensors 28,30 are structured to sense current in one of a hot conductor, a neutral conductor or a ground conductor for the receptacle 84.

Figure 7:
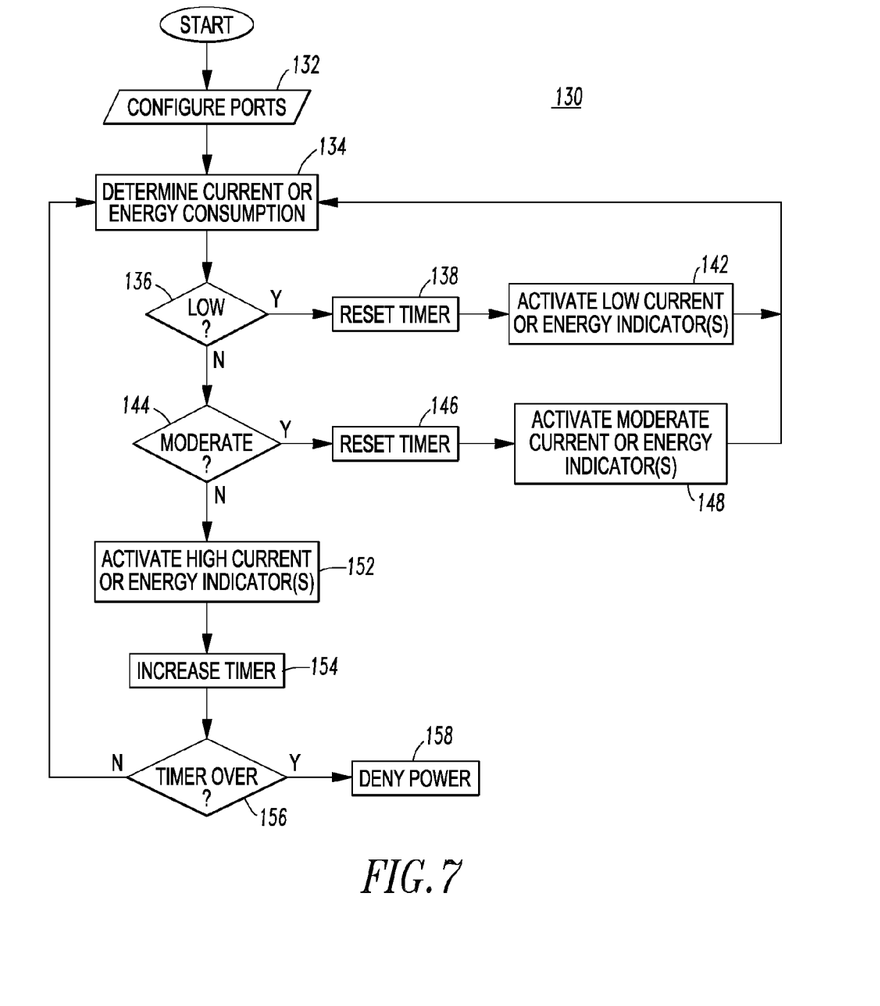
FIG. 7 is a flowchart of a routine executed by the microprocessor of FIG. 1.

FIG. 7 shows a routine 130 for the microprocessor 22 of FIGS. 1 and 2. The routine 130 is disclosed for one of the two example outlets 50,52 of FIG. 2 or for the load 4 of FIG. 1. After starting, at 132, the routine 130 configures digital and analog input and output ports (e.g., an analog input for the current sensor 12, a digital output to an actuator (not shown) of the operating mechanism 8, and outputs to the indicators 18,20) of the microprocessor 22. Next, at 134, the routine 130 determines current consumption from the current sensor 12. Then, at 136, it is determined if the sensed current is low (e.g., the sensed current is less than a first predetermined value (e.g., without limitation, 25-50% of rated current; any suitable value)). If so, then, at 138, a timer 140 (FIG. 1) is reset and a low current indicator is activated at 142 (e.g., without limitation, a low current color code is illuminated; a suitable count of indicators are illuminated).

On the other hand, if the sensed current is not low, then, at 144, it is determined if the sensed current is moderate (e.g., the sensed current is less than a second predetermined value (e.g., without limitation, 50-75% of rated current; any suitable value)). If so, then, at 146, the timer 140 (FIG. 1) is reset and a moderate current indicator is activated at 148 (e.g., without limitation, a moderate current color code is illuminated; a suitable count of indicators are illuminated).

On the other hand, if the sensed current is not moderate, then, at 152, a high current indicator is activated (e.g., without limitation, a high current color code is illuminated; a suitable count of indicators are illuminated). Next, at 154, the timer 140 (FIG. 1) is incremented. Then, at 156, if the timer 140 is over a predetermined time value, then the routine 130 denies power to the load (not shown, but see the load 4 of FIG. 1) and trips at 158 (e.g., the routine 130 opens the separable contacts 6 of FIG. 1 by outputting a trip signal to a trip actuator (not shown) for the operating mechanism 8). Otherwise, if the timer 140 is not over, then the routine 130 re-determines the current consumption from the sensed current at 134.

For example, the microprocessor 22 of FIG. 1 includes the timer 140 and the routine 130. The number of indicators 18,20 of FIG. 1 include a low current indicator, a moderate current indicator and a high current indicator. As has been described, the routine 130 determines current consumption from the sensed current at 134, activates the low current indicator and resets the timer 140 if the sensed current is less than the first predetermined value at 136, 138 and 142, activates the moderate current indicator and resets the timer 140 if the sensed current is less than a larger second predetermined value at 144, 146 and 148, and otherwise activates the high current indicator at 152. Then, after the high current indicator is activated, the routine 130 increases the timer 140 and determines if the timer 140 is over a predetermined time value at 154 and 156, and, if so, trips open the separable contacts 6 at 158.

Although a conventional ground fault receptacle 56 for an electrical box 54 (FIG. 2) and a conventional receptacle 84 for an electrical box 122 (FIG. 4) are disclosed, the disclosed concept can be used as part of electrical cord sets, electric cords and other types of electric outlets, with or without ground fault and/or arc fault protection, as was generally described, above, in connection with FIG. 1.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A smart receptacle for a number of loads, said smart receptacle comprising:
   separable contacts;
   an operating mechanism structured to open and close said separable contacts;
   a number of current sensors structured to sense current flowing through said separable contacts to one of said number of loads;
   a number of indicators structured to indicate a relative level of said sensed current; and
   a processor structured to input said sensed current, determine said relative level of said sensed current, and control said number of indicators to indicate said relative level of said sensed current,
   wherein the processor is further structured to control the operating mechanism to open said separable contacts when a magnitude of the sensed current is above a predetermined threshold value for a predetermined amount of time,
   wherein the processor is structured to control the number of indicators to provide a first indication if the relative level of the sensed current is within a first range, to provide a second indication if the relative level of the sensed current is within a second range, and to provide a third indication if the relative level of the sensed current is within a third range, and
   wherein the second range includes relative levels of current greater than relative levels of current included in the first range and the third range includes relative levels of current greater than relative levels of current included in the second range.

2. The smart receptacle of claim 1 wherein said number of current sensors include a current sensor selected from the group consisting of a current transformer, a resistive shunt and a current sensing device.

3. The smart receptacle of claim 1 wherein said smart receptacle includes two outlets; and wherein said number of current sensors include two current transformers, one for each of said two outlets.

4. The smart receptacle of claim 1 wherein said number of indicators is a plurality of LED indicators.

5. The smart receptacle of claim 1 wherein said smart receptacle includes two outlets; and wherein said number of indicators include a plurality of LED indicators for each of said two outlets.

6. The smart receptacle of claim 5 wherein said plurality of LED indicators are structured to indicate a plurality of different colors each of which corresponds to one the first, second, and third ranges.

7. The smart receptacle of claim 6 wherein the first range corresponds to an acceptable level of said sensed current, the second range corresponds to a larger cautionary level of said sensed current, and the third range correspond to a still larger problem level of said sensed current.

8. The smart receptacle of claim 7 wherein said processor is further structured to change at least one of color, intensity and blink frequency of a number of said plurality of LED indicators if said one of said number of loads has been drawing too much current or power and/or doing so for greater than a predetermined time period.

9. The smart receptacle of claim 1 wherein said number of current sensors and said number of indicators are carried by an integrated printed circuit board.

10. The smart receptacle of claim 1 wherein said number of current sensors include a current transformer as part of a current transformer assembly having a harness and connector for field installation.

11. The smart receptacle of claim 1 wherein said number of current sensors include a current transformer structured to sense current in one of a hot conductor, a neutral conductor or a ground conductor.

12. The smart receptacle of claim 1 wherein said number of indicators are further structured to indicate the relative level of said sensed current using a color code having a plurality of different colors one for each of the first, second, and third ranges.

13. The smart receptacle of claim 1 wherein said processor is further structured to consider for said color code an amount of current handled by other receptacles within a same branch circuit.

14. The smart receptacle of claim 1 wherein said smart receptacle is a smart ground fault receptacle.

15. The smart receptacle of claim 1, wherein the first range includes relative levels of current that are between 25% and 50% of a rated current of the smart receptacle, the second ranges includes levels of current that are between 50% and 75% of the rated current of the smart receptacle, and the third range includes levels of current that are greater than 75% of the rated current of the smart receptacle.

16. A receptacle plate or cover for a receptacle, said receptacle plate or cover comprising:
   a plate or cover member;
   a number of current sensors disposed on or about said plate or cover member and structured to sense current flowing through separable contacts to a load;

a number of indicators disposed on or about said plate or cover member and structured to indicate a relative level of said sensed current or corresponding energy;

a processor disposed on or about said plate or cover member and structured to input said sensed current, determine said relative level of said sensed current or the corresponding energy, and control said number of indicators to indicate said relative level of said sensed current or the corresponding energy.

17. The receptacle plate or cover of claim 16 wherein said number of indicators are a plurality of LEDs disposed under a lens on said plate or cover member.

18. The receptacle plate or cover of claim 16 wherein said receptacle includes two outlets; wherein said plate or cover member includes two openings each of which is structured to accept a corresponding one of said outlets; wherein said plate or cover member further includes two halo lens each of which is disposed around a corresponding one of said two openings; and wherein said number of indicators are two color indicators each of which is for a corresponding one of said two halo lens.

19. A receptacle, an electrical cord set, an electric cord or an electric outlet comprising:

separable contacts;

an operating mechanism structured to open and close said separable contacts;

a current sensor structured to sense current flowing through said separable contacts to a load;

a number of indicators structured to indicate a relative level of said sensed current or corresponding energy; and a processor structured to input said sensed current, determine said relative level of said sensed current or the corresponding energy, and control said number of indicators to indicate said relative level of said sensed current, or the corresponding energy, and wherein the processor is further structured to control the operating mechanism to open said separable contacts when a magnitude of the sensed current is above a predetermined threshold value for a predetermined amount of time, wherein said processor comprises a timer and a routine; wherein said number of indicators comprise a low current indicator, a moderate current indicator and a high current indicator; and wherein said routine is structured to determine current consumption from said sensed current, activate the low current indicator and reset the timer if the sensed current is less than a first predetermined value, activate the moderate current indicator and reset the timer if the sensed current is less than a larger second predetermined value, and otherwise activate the high current indicator.

20. The receptacle, the electrical cord set, the electric cord or the electric outlet of claim 19 wherein said receptacle is further structured to provide ground fault protection.

21. The receptacle, the electrical cord set, the electric cord or the electric outlet of claim 19 wherein said number of indicators is a bar made of a series of LEDs in order to indicate how much a branch circuit is loaded; and wherein said bar employs a color code and a number of LED lights, which increase an indication scale level as said sensed current increases.

22. The receptacle, the electrical cord set, the electric cord or the electric outlet of claim 19 wherein after said routine activates the high current indicator, said routine is further structured to increase the timer and determine if said timer is over a predetermined time value, and, if so, trip open said separable contacts, and, if not, re-determine said current consumption from said sensed current.

* * * * *